US009761438B1

(12) United States Patent
Chu et al.

(10) Patent No.: US 9,761,438 B1
(45) Date of Patent: Sep. 12, 2017

(54) METHOD FOR MANUFACTURING A SEMICONDUCTOR STRUCTURE HAVING A PASSIVATED III-NITRIDE LAYER

(71) Applicant: HRL Laboratories, LLC, Malibu, CA (US)

(72) Inventors: Rongming Chu, Agoura Hills, CA (US); Xu Chen, Los Angeles, CA (US)

(73) Assignee: HRL Laboratories, LLC, Malibu, CA (US)

( * ) Notice: Subject to any disclaimer, the term of this patent is extended or adjusted under 35 U.S.C. 154(b) by 2 days.

(21) Appl. No.: 14/272,993

(22) Filed: May 8, 2014

(51) Int. Cl.
| H01L 21/336 | (2006.01) |
| H01L 21/318 | (2006.01) |
| H01L 29/778 | (2006.01) |
| H01L 29/20 | (2006.01) |
| H01L 21/02 | (2006.01) |
| H01L 29/66 | (2006.01) |
| H01L 29/417 | (2006.01) |
| H01L 29/423 | (2006.01) |
| H01L 29/201 | (2006.01) |
| H01L 29/205 | (2006.01) |

(52) U.S. Cl.
CPC .... H01L 21/0217 (2013.01); H01L 21/02271 (2013.01); H01L 21/02274 (2013.01); H01L 29/2003 (2013.01); H01L 29/41766 (2013.01); H01L 29/4236 (2013.01); H01L 29/66462 (2013.01); H01L 29/778 (2013.01); H01L 29/7787 (2013.01)

(58) Field of Classification Search
CPC ............. H01L 29/2003; H01L 29/7787; H01L 21/3185; H01L 29/4236; H01L 29/518
See application file for complete search history.

(56) References Cited

U.S. PATENT DOCUMENTS

| 5,652,177 A * | 7/1997 | Pan ................... H01L 21/76202 257/E21.552 |
| 8,519,439 B2 * | 8/2013 | Saito ................. H01L 29/42316 257/192 |
| 2005/0067663 A1 * | 3/2005 | Ramkumar et al. .......... 257/410 |
| 2007/0001174 A1 * | 1/2007 | Ring ..................... H01L 21/045 257/76 |

(Continued)

FOREIGN PATENT DOCUMENTS

| JP | 2009-164300 | 7/2009 |
| KR | 10-2013-0030215 | 3/2013 |

OTHER PUBLICATIONS

Ekaterina Harvard, "440V AlSiN—Passivated AlGaN/GaN High Electron Mobility Transistor with 40 GHz Bandwidth", 2012 DRC, pp. 75-76.

(Continued)

*Primary Examiner* — Victor A Mandala
*Assistant Examiner* — Regan J Rundio
(74) *Attorney, Agent, or Firm* — Ladas & Parry

(57) ABSTRACT

A semiconductor structure comprising a layer of a III-N material and at least a portion of said layer being covered by a passivation layer, wherein the passivation layer comprises a first layer of SiN formed on said at least a portion of said III-N material layer and a second layer of SiN formed on said first layer of SiN; the first SiN layer having a first thickness and generating tensile stress in the structure and the second SiN layer having a second thickness and generating compressive stress in the structure.

6 Claims, 3 Drawing Sheets

(56) References Cited

U.S. PATENT DOCUMENTS

| | | | |
|---|---|---|---|
| 2009/0166815 A1* | 7/2009 | Makiyama | H01L 21/28264 257/640 |
| 2011/0006346 A1 | 1/2011 | Ando et al. | |
| 2011/0018040 A1 | 1/2011 | Smith et al. | |
| 2011/0024797 A1* | 2/2011 | Nakazawa | H01L 29/1029 257/194 |
| 2012/0178226 A1 | 7/2012 | Makiyama | |
| 2012/0181533 A1* | 7/2012 | Yoo | H01L 27/1248 257/43 |
| 2013/0247972 A1* | 9/2013 | Mungekar | H01L 31/02167 136/256 |
| 2013/0334538 A1* | 12/2013 | Saunier | H01L 29/778 257/76 |
| 2014/0231823 A1* | 8/2014 | Chowdhury | H01L 21/283 257/76 |
| 2014/0284613 A1* | 9/2014 | Kuraguchi | H01L 29/66462 257/76 |
| 2015/0145004 A1* | 5/2015 | Inoue | H01L 29/4236 257/192 |
| 2015/0249150 A1* | 9/2015 | Yamaguchi | H01L 29/66462 257/76 |
| 2015/0270355 A1* | 9/2015 | Kuraguchi | H01L 29/778 257/194 |

OTHER PUBLICATIONS

M. Germain, et al., "GaN-on-Si for Power Conversion", CS MANTECH, p. 225, (2010).

Ekaterina Harvard et al., "Performance of AlGaN/GaN High-Electron Mobility Transistors With AlSiN Passivation", IEEE transactions on electronic devices vol. 58 No. 1, pp. 87-94, (Jan. 2011).

"InAlGaN/AlN GaN-HEMTs with In-Situ SiN Passivation", ICPS 2012 poster 278, p. 237.

J.R. Shealy et al., "Growth and passivation of AlGaN/GaN heterostructures", Journal of Crystal Growth 250, pp. 7-13, (2003).

ISR/WO for related PCT/U52015/027175 mailed on Jul. 15, 2015.

International Preliminary Report on Patentability (IPRP) Chapter II from PCT/US15/27175 mailed on Aug. 26, 2016.

Material and optical properties of low-temperature NH3-free PECVD SiN x layers for photonic applications. Thalía Domínguez Bucio, Ali Z Khokhar, Cosimo Lacava, Stevan Stankovic, Goran Z Mashanovich, Periklis Petropoulos and Frederic Y Gardes Published Dec. 1, 2016; *Journal of Physics D: Applied Physics*, vol. 50, No. 2 http://iopscience.iop.org/article/10.1088/1361-6463/50/2/025106.

* cited by examiner

METHOD FOR MANUFACTURING A SEMICONDUCTOR STRUCTURE HAVING A PASSIVATED III-NITRIDE LAYER

CROSS REFERENCE TO RELATED APPLICATIONS

This application does not claim priority of a prior application.

BACKGROUND OF THE INVENTION

Field of the Invention

The disclosed technology relates to semiconductor structures, such as transistors, comprising a passivated III-Nitride layer, and a method for manufacturing thereof.

Description of the Related Technology

Semiconductor structures comprising a III-Nitride layer, such as a GaN transistor, can be utilized in high power, high frequency, and high temperature applications. GaN transistors are typically based on the formation of a heterojunction between a GaN region, typically known as the channel layer, and an overlying AlGaN region or layer, typically known as a barrier layer. The formation of a strongly adhering passivation layer on the top surface of the AlGaN region is important to the performance of the structure.

However, the passivation layer can introduce a number of technical problems. For example, a GaN transistor may comprise an AlGaN barrier layer covered by a SiN passivation layer. The transistor may also comprise a gate insulation layer that lies between the AlGaN barrier layer and the transistor's gate to prevent leakage current between the AlGaN barrier and the gate. A variety of deposited dielectric layers can be used to form the gate insulation layer. These deposited gate insulators include AlN, SiN, $Al_2O_3$, $HfO_2$, MgO, $Gd_2O_3$, $Ga_2O_3$, $ScO_2$, $SiO_2$, and/or their combinations. However, depositing the gate insulator generally requires at least one high temperature process step, which can degrade the SiN passivation layer of the AlGaN.

SiN passivation layers formed by PECVD (Plasma-Enhanced Chemical Vapor Deposition) on an AlGaN layer have been found most suitable for passivating an AlGaN barrier layer. PECVD deposited SiN layers are typically deposited at a temperature below 400 degree C. However, PECVD deposited SiN layers may have poor adhesion to the underlying semiconductor layer, and a high temperature process step conducted after the formation of a silicon nitride passivation layer has significant chances of delaminating the SiN passivation layer from the AlGaN layer. In particular, in the exemplary case of the manufacturing of a GaN transistor, great care must be taken if the gate insulator is to be formed after the SiN passivation layer to avoid delaminating the SiN passivation layer from the AlGaN layer, which causes the manufacturing to decrease in yield and degrade in performance.

It is known, for example from ICPS 2012 poster 278 *"InAlGaN/AlN GaN-HEMTs with In-Situ SiN Passivation"*; or CS MANTECH 2010 page 225 *"GaN-on-Si for Power Conversion"*, to passivate a III-Nitride layer of a semiconductor structure with a MOCVD (MetalOrganic Chemical Vapour Deposition,) SiN layer that increases the temperature stability of the SiN layer.

Passivation effects of LPCVD (Low Pressure Chemical vapor deposition) SiN on AlGaN/GaN are described for example in: *"Growth and passivation of AlGaN/GaN heterostructures"* by J. R. Shealy et al in Crystal Growth 250, 2003 page 7-13); and IEEE Transactions on electronic devices vol. 58 no. 1, 2011, page 87-94). A paper in 2012 DRC (page 75-76) *"440V AlSiN-Passivated AlGaN/GaN High Electron Mobility Transistor with 40 GHz Bandwidth"* reported LPCVD AlSiN passivated AlGaN/GaN HEMTs (although deposited after mesa), followed by Ohmic contacts and then PECVD SiN, and Schottky gates, and 440V Vbd with Lg 0.5 um, and 470V with Lg 1 um (S-G spacing 1 um; G-D spacing 5 um).

However, the inventors have found that GaN transistors' passivated LPCVD or MOCVD SiN layer alone has compromised dynamic performance as compared with PECVD SiN passivation. Therefore, there exists a need for a passivation scheme of a III-N material combining the merits of LPCVD/MOCVD SiN and LPCVD SiN.

SUMMARY OF THE DISCLOSURE

The present disclosure relates to a semiconductor structure having a passivation layer of a III-N material that comprises a first layer of SiN that generates tensile stress, covered by a second layer of SiN that generates compressive stress. According to an embodiment of the present disclosure, the first layer of SiN can be formed by MOCVD or LPCVD and the second layer of SiN can be formed by PECVD.

An embodiment of the present disclosure relates to a semiconductor structure comprising a layer of a III-N material; at least a portion of said layer being covered by a passivation layer, wherein the passivation layer comprises a first layer of SiN formed on said at least a portion of said III-N material layer; the first SiN layer having a first thickness and generating tensile stress in the structure; and a second layer of SiN formed on said first layer of SiN; the second SiN layer having a second thickness and generating compressive stress in the structure.

According to an embodiment of the present disclosure, the III-N material is AlGaN.

According to an embodiment of the present disclosure, the first SiN layer is formed by MOCVD or LPCVD.

According to an embodiment of the present disclosure, the second SiN layer is formed by PECVD.

According to an embodiment of the present disclosure, the first SiN layer has a Si/N ratio lower than 1 and the second SiN layer has a Si/N ratio greater than 1.

According to an embodiment of the present disclosure, the first SiN layer has a H content lower than 5% and the second SiN layer has a H content greater than 5%.

According to an embodiment of the present disclosure the first SiN layer comprises 44.2% of Si, 54.7% of N, 0.6% of H and 0.5% of Cl; and the second SiN layer comprises 43.5% of Si, 33.5% of N and 23% of H.

According to an embodiment of the present disclosure, the first SiN layer is formed at a temperature higher than 600 degree C. and the second SiN layer is formed at a temperature lower than 400 degree C.

According to an embodiment of the present disclosure, the first SiN layer is 2~50 nm thick and the second SiN layer is 50~200 nm thick.

According to an embodiment of the present disclosure, the semiconductor structure comprises a transistor using the III-N material layer as a barrier layer; the transistor comprising a gate insulator layer formed after the first and second SiN layers.

An embodiment of the present disclosure relates to a method of manufacturing a semiconductor structure, the method comprising forming a layer of a III-N material; covering at least a portion of said III-N material layer with a first layer of SiN; the first SiN layer having a first thickness and generating tensile stress in the structure; and covering the first layer of SiN with a second layer of SiN; the second SiN layer having a second thickness and generating compressive stress in the structure.

According to an embodiment of the present disclosure, the III-N material is AlGaN.

According to an embodiment of the present disclosure, the method comprises forming the first SiN layer by MOCVD or LPCVD.

According to an embodiment of the present disclosure, the method comprises forming the second SiN layer by PECVD.

According to an embodiment of the present disclosure, the method comprises forming the first SiN layer with a Si/N ratio lower than 1 and the second SiN layer with a Si/N ratio greater than 1.

According to an embodiment of the present disclosure, the method comprises forming the first SiN layer with a H content lower than 5% and the second SiN layer with a H content greater than 5%.

According to an embodiment of the present disclosure, the method comprises forming the first SiN layer with 44.2% of Si, 54.7% of N, 0.6% of H and 0.5% of Cl; and forming the second SiN layer with 43.5% of Si, 33.5% of N and 23% of H.

According to an embodiment of the present disclosure, the method comprises forming the first SiN layer at a temperature higher than 600 degree C. and forming the second SiN layer at a temperature lower than 400 degree C.

According to an embodiment of the present disclosure, the method comprises forming the first SiN layer with a thickness of 2-50 nm and the second SiN layer with a thickness of 50-200 nm.

According to an embodiment of the present disclosure, the method comprises forming a transistor using the III-N material layer as a barrier layer; said forming a transistor comprising forming a gate insulator layer of the transistor after the first and second SiN layers.

An embodiment of the present disclosure also relates to a III-nitride transistor having a passivation dielectric consisting of a SiN layer deposited at high-temperature (above 600 C), followed by a SiN layer deposited at low-temperature (below 400 C);

According to an embodiment of the present disclosure, the gate trench of the III-nitride transistor is formed through the dielectric layer and into the semiconductor layer.

According to an embodiment of the present disclosure, the gate trench of the III-nitride transistor comprises a gate metal filling that forms an integrated gate field-plate.

Another embodiment of the present disclosure relates to a process of making a transistor, for example such as described above, with the following sequence:
1) Deposition of a high-temperature SiN layer by low-pressure chemical-vapor-deposition or metal-organic chemical-vapor-deposition;
2) Deposition of a low-temperature SiN layer by plasma-enhanced chemical-vapor-deposition;
3) Formation of a gate trench through the dielectric layers with the bottom of the trench stopped on the semiconductor surface or into the semiconductor;
4) Formation of a gate insulator covering at least the bottom of the gate trench;
5) Formation of source/drain ohmic contacts through the dielectric layers and into the semiconductor;
6) Formation of a gate electrode with the gate metal filling the gate trench, and extending out of the trench on top of the dielectric layer.

Figure 1:
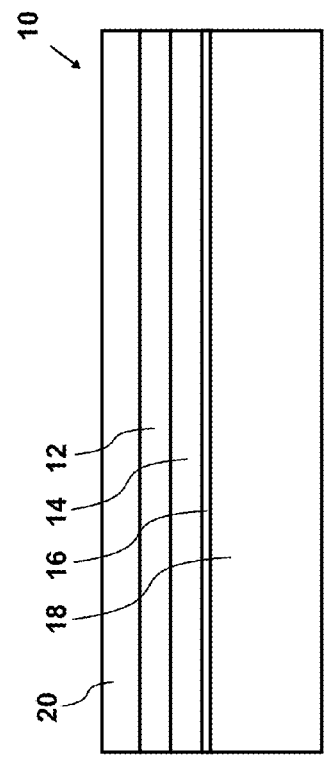
FIGS. 1 to 6 illustrate steps of manufacturing of an exemplary transistor according to an embodiment of the present disclosure. The drawings are intended to illustrate some aspects and embodiments of the present disclosure.

The drawings described are only schematic and are non-limiting.

DETAILED DESCRIPTION OF CERTAIN ILLUSTRATIVE EMBODIMENTS

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

Furthermore, the various embodiments, although referred to as "preferred" are to be construed as exemplary manners in which the disclosure may be implemented rather than as limiting the scope of the disclosure.

The term "comprising", used in the claims, should not be interpreted as being restricted to the elements or steps listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising A and B" should not be limited to devices consisting only of components A and B, rather with respect to the present disclosure, the only enumerated components of the device are A and B, and further the claim should be interpreted as including equivalents of those components.

FIGS. 1-6 illustrate a method for manufacturing an enhancement mode (e-mode) III-Nitride HEMT according to an embodiment of the present disclosure.

FIG. 1 shows a semiconductor structure 10 comprising a SiN layer 12 formed on top of an AlGaN barrier layer 14, itself formed on top of an AlN spacer layer 16, itself formed on top of a GaN channel layer 18. According to an embodiment of the present disclosure, SiN layer 12 can be formed by MOCVD or LPCVD. According to an embodiment of the present disclosure, SiN layer 12 is formed at a temperature higher than 600 degree C. According to an embodiment of the present disclosure, SiN layer 12 has a Si/N ratio lower than 1. According to an embodiment of the present disclosure, SiN layer 12 has a H content lower than 5%. According to an embodiment of the present disclosure, SiN layer 12 comprises 44.2% of Si, 54.7% of N, 0.6% of H and 0.5% of Cl. According to an embodiment of the present disclosure, SiN layer 12 can have a thickness comprised between 2 and 50 nm. According to an embodiment of the present disclosure, SiN layer 12 can have a thickness of 20 nm.

Figure 2:
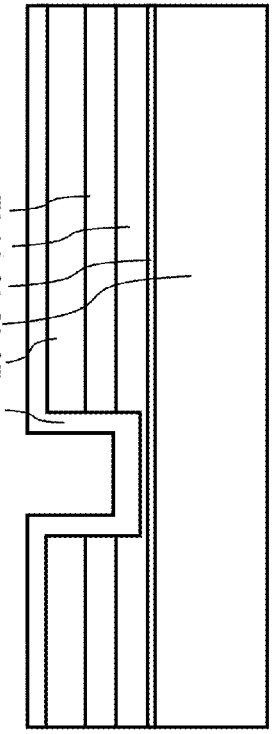

In FIG. 2, a SiN layer 20 was formed on top of SiN layer 12 of semiconductor structure 10. According to an embodiment of the present disclosure, SiN layer 20 can be formed by PECVD. According to an embodiment of the present disclosure, SiN layer 20 is formed at a temperature lower than 400 degree C. According to an embodiment of the present disclosure, SiN layer 20 has a Si/N ratio greater than 1. According to an embodiment of the present disclosure, SiN layer 20 has a H content greater than 5%. According to an embodiment of the present disclosure, SiN layer 20 comprises 43.5% of Si, 33.5% of N and 23% of H. According to an embodiment of the present disclosure, SiN layer 20 can have a thickness comprised between 50 and 200 nm. According to an embodiment of the present disclosure, SiN layer 20 can have a thickness of 100 nm.

SiN layer 20 generates compressive stress, or compressive residual stress, in structure 10 and SiN layer 12 generates tensile stress, or tensile residual stress, in structure 10. In other words, SiN layer 20 would have a slightly larger surface if it were not attached to structure 10, but structure 10 prevents layer 20 from having a larger surface, thus generating compressive stress in the structure. Similarly, SiN layer 12 would have a slightly smaller surface if it were not attached to structure 10, but structure 10 prevents layer 12 from having a smaller surface, thus generating tensile stress in the structure.

The inventors have noted that a SiN passivation layer generating compressive stress, such as Sin Layer 20, formed on top of a SiN passivation layer generating tensile stress, such as SiN layer 12, creates a combination SiN passivation layer that is remarkably stable. The inventors have noted that such a combination SiN passivation layer is in particular remarkably resistant to high temperature manufacturing steps conducted after completion of the combination SiN passivation layer.

Figure 3:
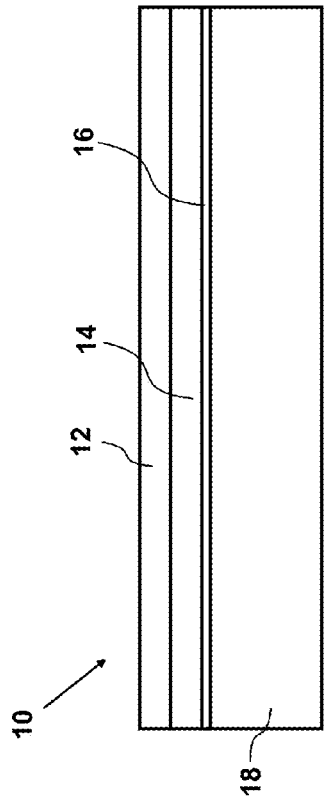

In FIG. 3, a transistor gate trench 22 was etched through SiN layers 12 and 20 and into barrier layer 14, close to spacer layer 16. Etching of the trench can for example be accomplished by Fluorine-based plasma etch.

Figure 4:
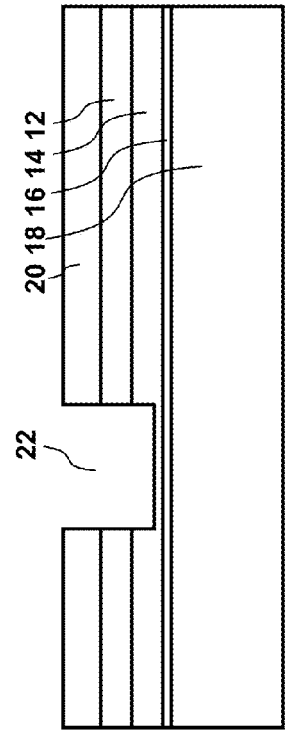

In FIG. 4, an insulating layer 24 was formed over at least the bottom of trench 22. According to an embodiment of the present disclosure (as illustrated in FIG. 4), insulating layer 24 also covers the walls of trench 22. According to an embodiment of the present disclosure (as illustrated in FIG. 4), insulating layer 24 also covers SiN layer 20. The material of insulating layer 24 can be AlN, SiN $Al_2O_3$, $HfO_2$, MgO, $Gd_2O_3$, $Ga_2O_3$, $ScO_2$, $SiO_2$, or combinations thereof.

Insulating layer 24, which acts as gate dielectric, can according to an embodiment of the present disclosure be deposited at a temperature greater than 500 degree C. by MOCVD or MBE (Molecular Beam Epitaxy). Advantageously, the passivation layer formed in combination by layers 20 and 12 shows a good resistance to subsequent high temperature process steps, such as the step of depositing the gate dielectric. For example, the passivation layer formed in combination by layers 20 and 12 does not delaminate when the gate dielectric 24 is deposited.

Figure 5:
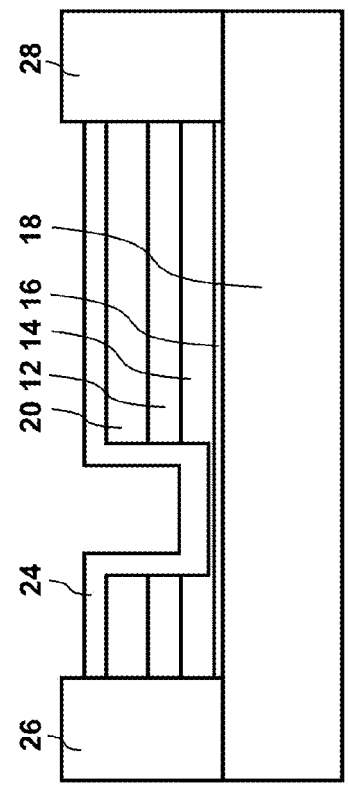

In FIG. 5, a source Ohmic contact electrode 26 and a drain Ohmic contact electrode 28 have been formed in recesses formed through insulating layer 24, SiN layers 20 and 12, barrier layer 14 and spacer layer 16, in contact with channel layer 18. The material of electrodes 26 and 28 can be Ti/Al.

Figure 6:
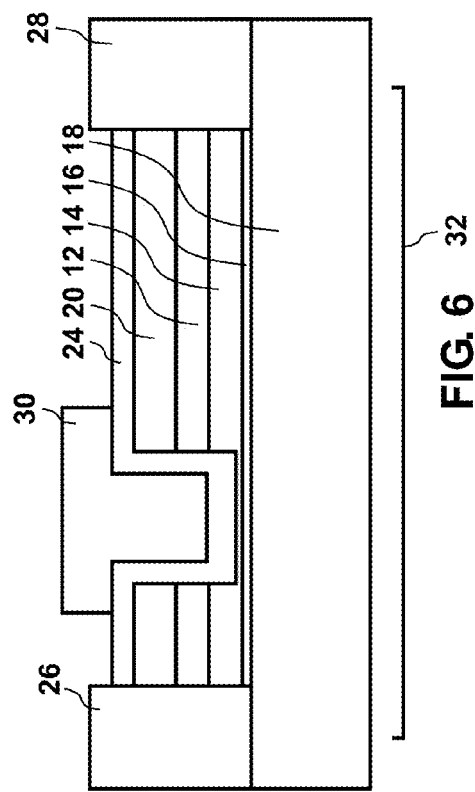

In FIG. 6, a gate electrode 30 has been formed on the insulating layer 24 in the trench 22, thus completing a transistor 32 having source electrode 26, gate electrode 30 and drain electrode 28. The material of electrode 30 can be Ti, TiN, Ni, or Al. According to an embodiment of the present disclosure, a top portion of gate electrode 30 can develop horizontally, for example over a portion of insulator layer 24, and form a gate field plate.

Figure 7:
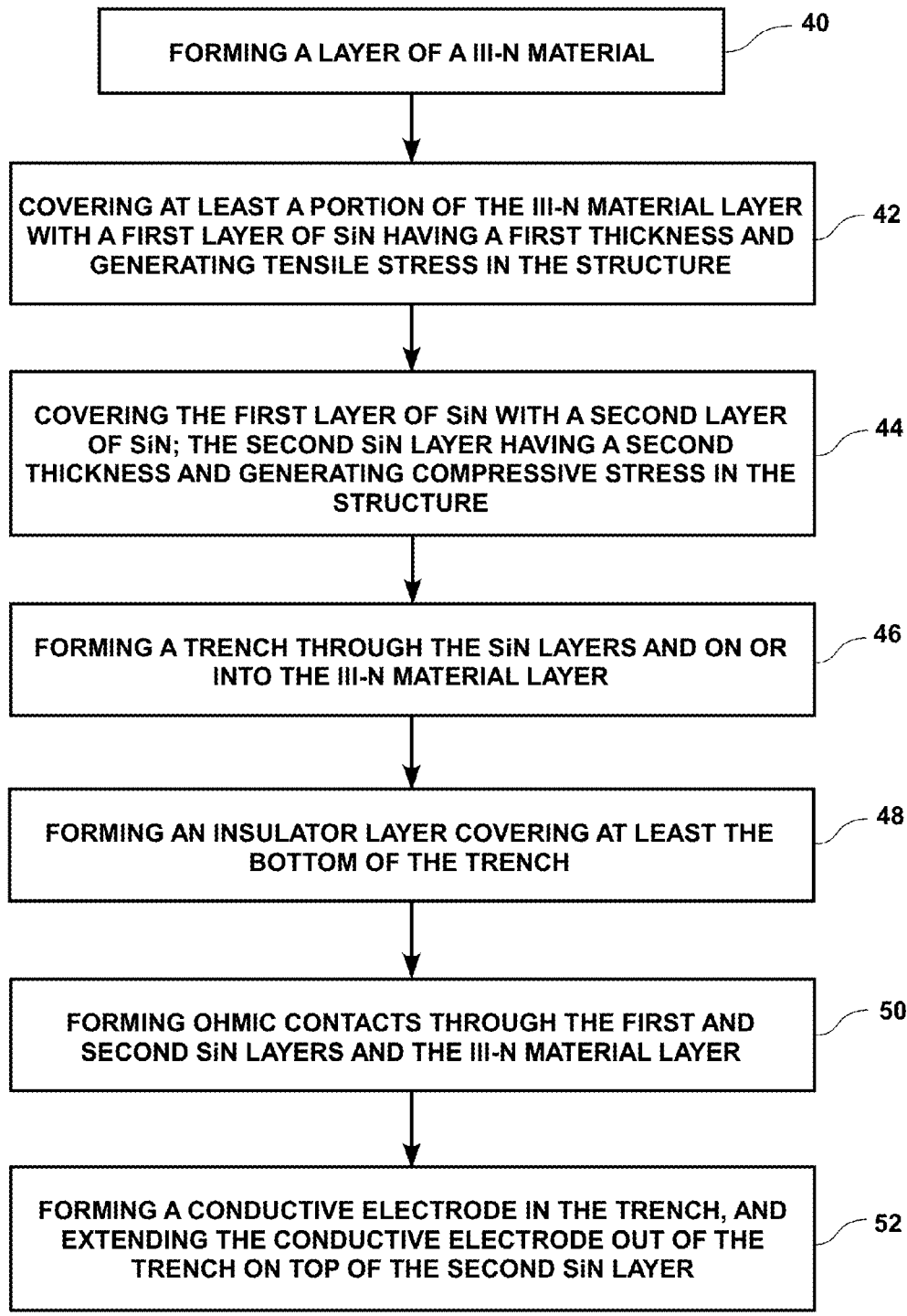
FIG. 7 is a flow chart illustrating a method of manufacturing a transistor according to an embodiment of the present disclosure.

FIG. 7 is a flow chart illustrating a method of manufacturing a transistor according to an embodiment of the present disclosure. The method comprises:

forming 40 a layer 14 of a III-N material;

covering 42 at least a portion of said III-N material layer 14 with a first layer 12 of SiN; the first SiN layer 12 having a first thickness and generating tensile stress in the structure; and covering 44 the first layer 12 of SiN with a second layer 20 of SiN; the second SiN layer 20 having a second thickness and generating compressive stress in the structure.

According to an embodiment of the present disclosure, the method additionally comprises:

forming 46 a trench 22 through the SiN layers 20, 12 and on or into the III-N material layer. The trench is to become the gate trench of a transistor 32;

forming 48 an insulator layer 24 (gate oxide) covering at least the bottom of the trench;

forming 50 ohmic contacts (source and drain contacts 26, 28 of the transistor) through the first 12 and second 20 SiN layers and the III-N material layer 14; and forming 52 a conductive electrode 30 (for example metallic) in the trench, and optionally extending the conductive electrode 30 out of the trench on top of the second SiN layer 20, thus forming a gate electrode and optionally a gate field plate.

The foregoing description details certain embodiments of the invention. It will be appreciated, however, that no matter how detailed the foregoing appears in text, the invention may be practiced in many ways.

For example, the above description was made in relation with a passivation layer of a portion of a HEMT. However, embodiments of the present disclosure also relate to passivation layers above portions of other electronic components such as other transistors, or diodes, shottky diodes, photodiodes, etc. . . .

Further, the above description was made in relation with the use of a combination SiN passivation layer for passivating an AlGaN layer. However, a combination SiN passivation layer according to an embodiment of the present disclosure can also be used to passivate layers of GaN, AlInGaN, AlInN, AlN, InGaN or other III-N layers.

Also, the above description was made in relation with the use of a combination SiN passivation layer 12, 20 for passivating an AlGaN layer 14 formed on top of an AlN spacer layer 16, itself formed on top of a GaN channel layer 18, but a combination SiN passivation layer 12, 20 according to an embodiment of the present disclosure can also be used to passivate other AlGaN/GaN heterostructures.

It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

The invention claimed is:

1. A method of manufacturing a semiconductor structure; the method comprising:
    forming a layer of a III-N material;
    covering at least a portion of said III-N material layer with a first layer of SiN; the first SiN layer having a first thickness and generating tensile stress in the structure; and
    covering the first layer of SiN with a second layer of SiN; the second SiN layer having a second thickness and generating compressive stress in the structure; comprising forming the first SiN layer with a H content lower than 5% and the second SiN layer with a H content greater than 5%;
    the method further comprising forming the first SiN layer at a temperature higher than 600 degree C. and forming the second SiN layer at a temperature lower than 400 degree C.

2. The method of claim 1, wherein the III-N material is AlGaN.

3. The method of claim 1, comprising:
    forming the first SiN layer with 44.2% of Si, 54.7% of N, 0.6% of H and 0.5% of Cl; and
    forming the second SiN layer with 43.5% of Si, 33.5% of N and 23% of H.

4. The method of claim 1, comprising forming the first SiN layer with a thickness of 2-50 nm and the second SiN layer with a thickness of 50-200 nm.

5. The method of claim 2, wherein the layer of a III-N material is formed on an AlN spacer layer on a GaN channel layer.

6. The method of claim 1, further comprising forming a transistor using the III-N material layer as a barrier layer; said forming a transistor including:
    filling recesses passing through said first and second SiN layers and said barrier layer with a source Ohmic contact electrode and a drain Ohmic contact electrode both contacting a channel layer below said barrier layer; and
    forming a gate trench through the passivation layer with a bottom of the trench contacting said III-N material layer, and forming an insulating layer over the bottom of the gate trench, over the walls of the gate trench and over the second SiN layer and in contact with the source Ohmic contact electrode and the drain Ohmic contact electrode.

* * * * *